US011424746B1

(12) United States Patent
Chuang et al.

(10) Patent No.: US 11,424,746 B1
(45) Date of Patent: Aug. 23, 2022

(54) REFERENCE-LESS CLOCK AND DATA RECOVERY DEVICE AND METHOD

(71) Applicant: REALTEK SEMICONDUCTOR CORP., Hsinchu (TW)

(72) Inventors: Hsiu-Ming Chuang, Hsinchu (TW); Wei-Cheng Tang, Hsinchu (TW); Li-Lung Kao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/331,991

(22) Filed: May 27, 2021

(30) Foreign Application Priority Data

Jan. 29, 2021 (TW) .................................. 110103607

(51) Int. Cl.
| | | |
|---|---|---|
| *H03D 3/24* | (2006.01) | |
| *H03L 7/08* | (2006.01) | |
| *H03L 7/091* | (2006.01) | |
| *H03L 7/10* | (2006.01) | |
| *H03L 7/099* | (2006.01) | |

(52) U.S. Cl.
CPC ............ *H03L 7/0807* (2013.01); *H03L 7/091* (2013.01); *H03L 7/0991* (2013.01); *H03L 7/102* (2013.01)

(58) Field of Classification Search
CPC ....... H03L 7/0807; H03L 7/091; H03L 7/102; H03L 7/0991; H03L 7/0995; H03L 7/087; G11B 20/10222; H04L 7/0338; G06F 1/12

USPC .......... 375/373–376, 362, 364–368, 326, 327
See application file for complete search history.

(56) References Cited

U.S. PATENT DOCUMENTS

| | | | | |
|---|---|---|---|---|
| 8,014,481 | B1 * | 9/2011 | Chiang | ................. H04L 7/0338 370/332 |
| 2005/0286643 | A1 * | 12/2005 | Ozawa | .................... H03L 7/087 375/376 |
| 2006/0023824 | A1 * | 2/2006 | Greco | ................... H03L 7/0995 375/371 |
| 2010/0020250 | A1 * | 1/2010 | Okamoto | ......... G11B 20/10222 348/739 |
| 2014/0351359 | A1 * | 11/2014 | Grocutt | ..................... G06F 1/12 709/209 |
| 2016/0301522 | A1 * | 10/2016 | Tetzlaff | .................. H04B 3/462 |

* cited by examiner

*Primary Examiner* — Phuong Phu
(74) *Attorney, Agent, or Firm* — Birch, Stewart, Kolasch & Birch, LLP (57) ABSTRACT

A reference-less dock and data recovery device includes a CDR circuit, an oscillator circuit, and a processor. The CDR circuit is configured to generate a first clock signal through synchronization according to a data signal having a first frequency in a first time period. The oscillator circuit is configured to output an oscillating clock signal according to the first clock signal, A frequency of the oscillating clock signal is substantially identical to that of the first clock signal. The processor oversamples the data signal having a second frequency in a second time period to generate a simulated preparation signal conforming to the second frequency. The CDR circuit is configured to generate a second clock signal through synchronization according to the simulated preparation signal. Before generating the second clock signal, the CDR circuit is synchronized to the oscillating clock signal to maintain outputting of the first clock signal.

20 Claims, 8 Drawing Sheets

REFERENCE-LESS CLOCK AND DATA RECOVERY DEVICE AND METHOD

CROSS-REFERENCE TO RELATED APPLICATION

This non-provisional application claims priority under 35 U.S.C. § 119(a) to Patent Application No. 110103607 filed in Taiwan, R.O.C. on Jan. 29, 2021, the entire contents of which are hereby incorporated by reference.

BACKGROUND

Technical Field

The present invention relates to clock and data recovery technologies, and in particular, to a reference-less clock and data recovery device and method.

Related Art

In a signal transmission interface, a transmitting terminal generates a data signal according to a data transmission frequency and transmits the data signal to a receiving terminal. In order to correctly identify a logic level of the data signal, the receiving terminal needs to read the data signal according to a clock signal synchronized to the data transmission frequency of the transmitting terminal. Therefore, the receiving terminal often uses a clock and data recovery (CDR) circuit to recover the data transmission frequency and a clock of the transmitting terminal.

Current transmission interfaces may be roughly classified into two categories: a first one having both a data signal line and a clock signal line (such as USB3.0, HDMI, or the like) and a second one having only a data signal line but no clock signal line (such as MIN M-PHY, USB2.0, or the like). In order to obtain an accurate data transmission frequency, for the first transmission interface, the receiving terminal may be configured with a reference clock and data recovery (reference CDR) circuit to recover the data transmission frequency of the transmitting terminal, and for the second transmission interface, the receiving terminal may be configured with a reference-less clock and data recovery (reference-less CDR) circuit to recover the data transmission frequency of the transmitting terminal.

Generally, when the reference-less clock and data recovery circuit is used, the transmitting terminal needs to provide a synchronization signal (e.g., a data signal that includes only a synchronization point for the clock and data recovery circuit to identify the data transmission frequency), so that the reference-less clock and data recovery circuit at the receiving terminal generates clock signals of different frequencies according to the synchronization signal. When the data transmission frequency changes, the traditional architecture encounters the following problems: (1) increase of system power consumption; (2) increase of a system burden, and (3) the clock and data recovery circuit being in an unsynchronized state for a time period, that is, a failure of the clock and data recovery circuit to output a clock signal during the time period.

SUMMARY

In view of the above, the present invention provides a reference-less clock and data recovery device and method. When a data transmission frequency is transformed, a clock and data recovery circuit generates a clock signal corresponding to the transformed data transmission frequency, so that system power consumption and a system burden can be reduced, and the clock and data recovery circuit can continuously output clock signals for operation of a receiving terminal.

According to some embodiments, the reference-less clock and data recovery device includes a clock and data recovery circuit, an oscillator circuit, and a processor. The clock and data recovery circuit is configured to receive a data signal from a data transmitting terminal. A transmission frequency of the data signal is a first frequency in a first time period, and the transmission frequency of the data signal is transformed to a second frequency in a second time period. The clock and data recovery circuit generates a first clock signal through synchronization according to the data signal in the first time period. The oscillator circuit is coupled to the clock and data recovery circuit. The oscillator circuit is configured to output an oscillating clock signal according to the first clock signal. A frequency of the oscillating clock signal is substantially identical to a frequency of the first clock signal. The processor is coupled to the clock and data recovery circuit. The processor is configured to execute a resynchronization procedure to oversample the data signal in the second time period to generate a simulated preparation signal conforming to the second frequency. The clock and data recovery circuit generate a second clock signal through synchronization according to the simulated preparation signal. Before the second clock signal is generated through synchronization, the clock and data recovery circuit is synchronized to the oscillating clock signal to maintain outputting of the first clock signal.

According to some embodiments, the reference-less clock and data recovery method is adapted to a reference-less clock and data recovery device. The reference-less clock and data recovery device includes a clock and data recovery circuit, an oscillator circuit, and a processor. The reference-less clock and data recovery method includes: receiving, by the clock and data recovery circuit, a data signal from a data transmitting terminal, where a transmission frequency of the data signal is a first frequency in a first time period and is transformed to a second frequency in a second time period; generating, by the clock and data recovery circuit, a first clock signal through synchronization according to the data signal in the first time period; outputting, by the oscillator circuit, an oscillating clock signal according to the first clock signal, wherein a frequency of the oscillating clock signal is substantially identical to a frequency of the first clock signal; executing, by the processor, a resynchronization procedure to oversample the data signal in the second time period to generate a simulated preparation signal conforming to the second frequency; generating, by the clock and data recovery circuit, a second clock signal through synchronization according to the simulated preparation signal; and before generating the second clock signal through synchronization, synchronizing the clock and data recovery circuit to the oscillating clock signal to maintain outputting of the first clock signal.

Therefore, according to some embodiments, the oscillator circuit generates the clock signal corresponding to the data signal before the frequency transformation, so that the clock and data recovery circuit continuously output the clock signal, and the data receiving terminal can continuously obtain the to-be-transmitted data carried in the data signal according to the clock signal. By oversampling the data signal after the frequency transformation to obtain the simulated preparation signal, the clock and data recovery circuit can generate, through synchronization, the clock signal corresponding to the data signal after the frequency transformation according to the simulated preparation signal, thereby reducing the system power consumption and the system burden.

DETAILED DESCRIPTION

Figure 1:
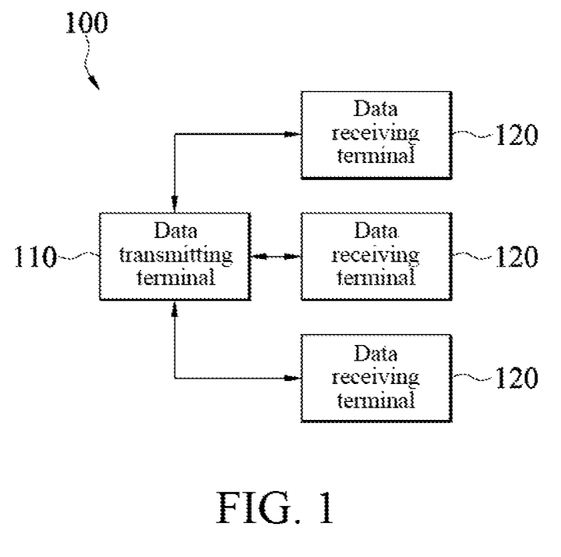
FIG. 1 illustrates a schematic block diagram of an electronic system according to some embodiments.
Figure 8:
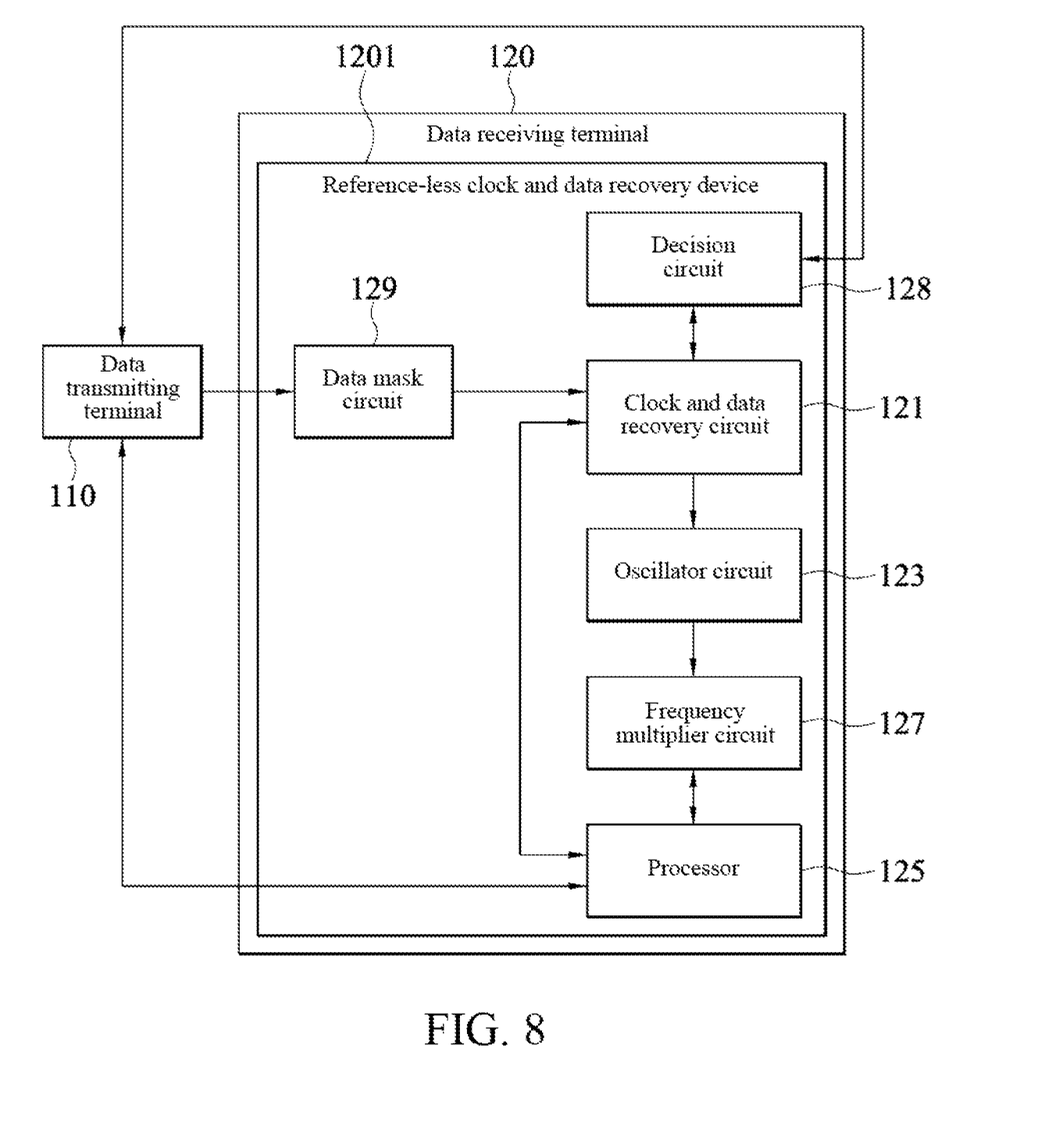
FIG. 8 illustrates a schematic block diagram of a reference-less clock and data recovery device according to some embodiments.
Figure 9:
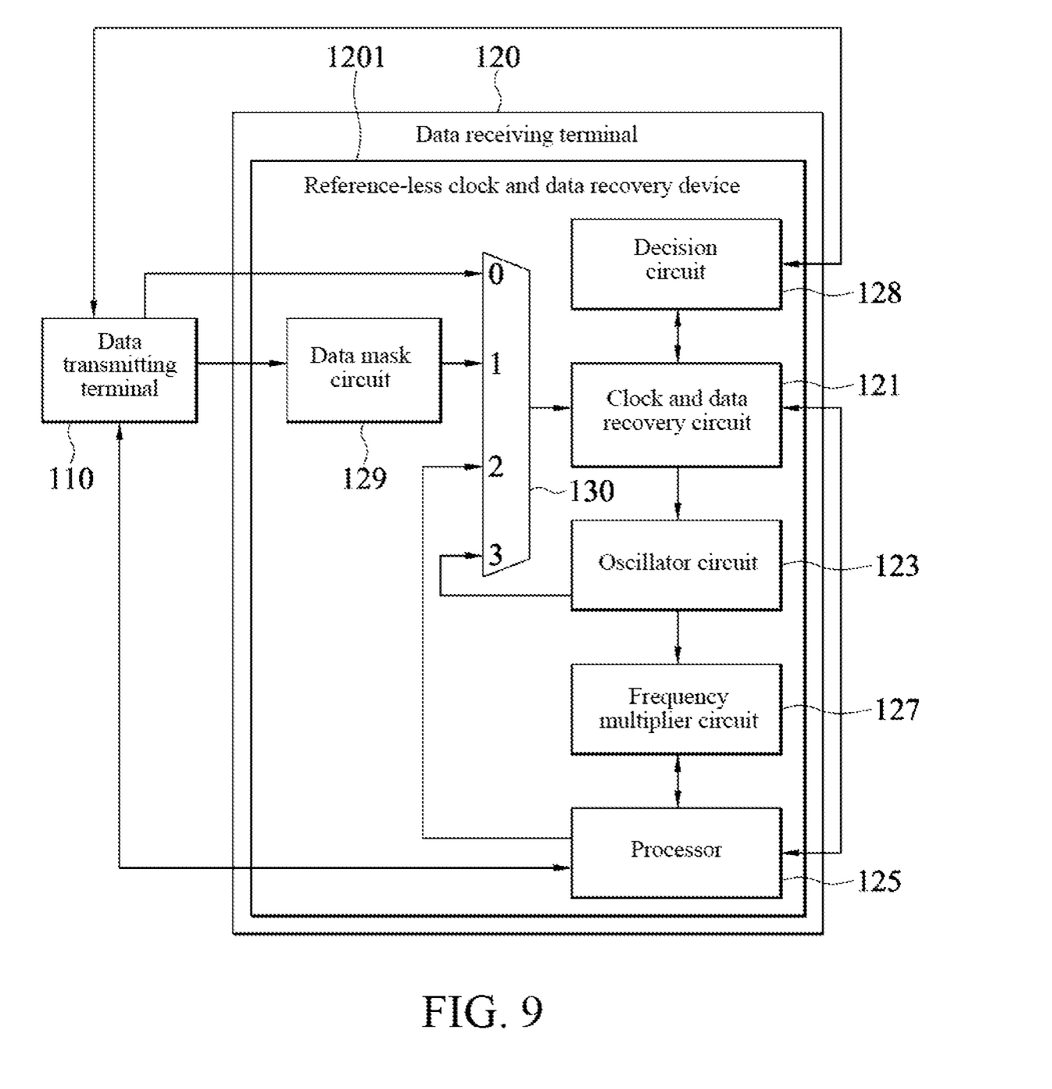
FIG. 9 illustrates a schematic block diagram of a reference-less clock and data recovery device according to some embodiments.

Referring to FIG. 1, FIG. 1 illustrates a schematic block diagram of an electronic system 100 according to some embodiments. The electronic system 100 is adapted to an audio transmission system and/or a video transmission system. The electronic system 100 includes a data transmitting terminal 110 and a plurality of data receiving terminals 120. A plurality of data receiving terminals 120 are generally provided, but the present invention is not limited thereto. In some cases, only one data receiving terminal 120 may be provided. The data transmitting terminal 110 is coupled to the data receiving terminals 120. In some embodiments, the data transmitting terminal 110 may be a control device configured to control operation of the electronic system 100. For example, the data transmitting terminal 110 transmits a data signal to control the operation of the electronic system 100, The data transmitting terminal 110 is, for example, but not limited to, a desktop computer, a notebook computer, a mobile device, or the like. In some embodiments, the data receiving terminal 120 may be controlled by the data transmitting terminal 110 to receive and read a signal (e.g., the data signal) transmitted by the data transmitting terminal 110. The data signal is, for example, but not limited to an audio signal or a video signal. The data receiving terminal 120 is, for example, but not limited to an audio or video output device such as a speaker, a loudspeaker, a smart speaker, an earphone, a television, or the like. The data transmitting terminal 110 and the data receiving terminal 120 are coupled together through a transmission interface that transmits only a data signal rather than a reference clock, such as a MIPI M-PHY transmission interface, USB2.0, or the like, but the present invention is not limited thereto. A reference-less clock and data recovery device 1201 is disposed on the data receiving terminal 120 (as shown in FIG. 2, FIG. 8, and FIG. 9).

Figure 2:
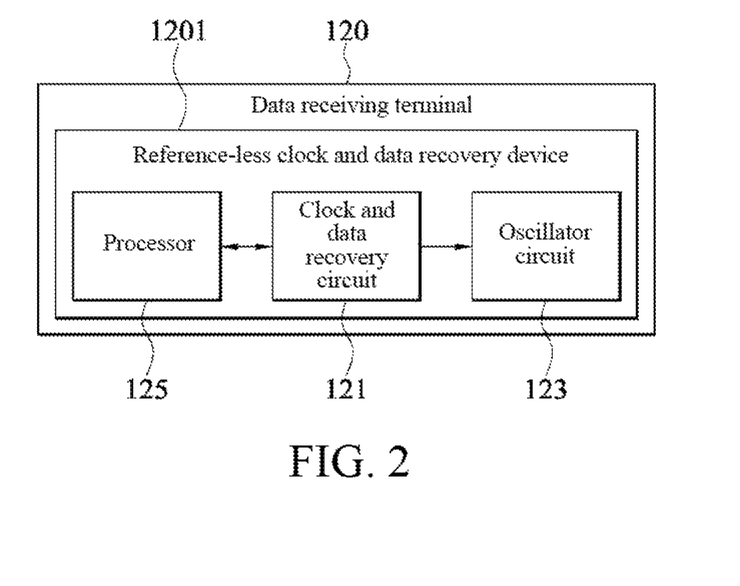
FIG. 2 illustrates a schematic block diagram of a reference-less clock and data recovery device according to some embodiments.

Referring to FIG. 2, FIG. 2, illustrates a schematic block diagram of a reference-less clock and data recovery device 1201 according to some embodiments. The reference-less clock and data recovery device 1201 may include a clock and data recovery circuit 121, an oscillator circuit 123, and a processor 125. The oscillator circuit 123 is coupled to the clock and data recovery circuit 121, and the processor 125 is coupled to the clock and data recovery circuit 121. The clock and data recovery circuit 121 is a reference-less clock and data recovery circuit. The oscillator circuit 123 is, for example, but not limited to a crystal oscillator such as a quartz crystal oscillator or a non-crystal oscillator. The processor 125 is, for example, but not limited to an operation circuit such as a central processing unit, a microprocessor, an application-specific integrated circuit (ASIC), a system on a chip (SOC), or the like.

Figure 3:
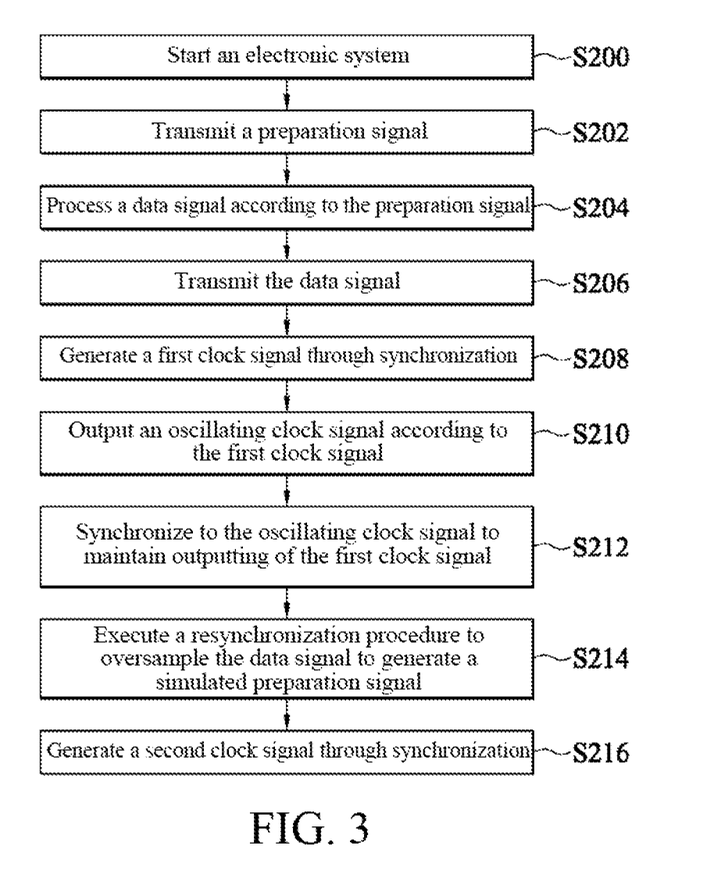
FIG. 3 illustrates a flowchart of reference-less clock and data recovery according to some embodiments.

Referring to FIG. 3, FIG. 3 illustrates a flowchart of reference-less clock and data recovery according to some embodiments. The reference-less clock and data recovery method is adapted to be performed by a reference-less clock and data recovery device 1201. Referring to FIG. 1, first, the electronic system 100 is turned on (step S200). For example, power starts to be supplied to the electronic system 100. After the electronic system 100 is turned on, the data transmitting terminal 110 transmits a preparation signal (e.g., having a specific signal pattern, which is alternatively referred to as a training pattern) to the data receiving terminal 120 (step S202). After receiving the preparation signal, the data receiving terminal 120 processes, according to the preparation signal, a subsequent data signal received from the data transmitting terminal 110 (step S204) (described in detail later).

Referring to FIG. 2, after continuously transmitting the preparation signal for a time period (for the convenience of description, the time period during which the data transmitting terminal 110 continuously transmits the preparation signal is referred to as a preparation time period), the data transmitting terminal 110 transmits the data signal to the data receiving terminal 120 (step S206). When the data receiving terminal 120 receives the data signal and a transmission frequency of the data signal is not changed (for convenience of description, a time period during which the transmission frequency of the data signal is not changed is referred to as a first time period, and the transmission frequency of the data signal before the change is referred to as a first frequency), a corresponding clock signal is generated through synchronization (for convenience of description, the clock signal corresponding to the first frequency is referred to as a first clock signal below) (step S208).

In some embodiments, the clock and data recovery circuit 121 in the reference-less clock and data recovery device 1201 of the data receiving terminal 120 generates the first clock signal through synchronization according to the data signal in the first time period. For example, the clock and data recovery circuit 121 may perform frequency locking (described in detail later) and phase locking (described in detail later) for the data signal in the first time period to generate the first clock signal through synchronization. The synchronization herein means that a frequency and a phase of the first clock signal are adjusted to be identical to a frequency (i.e., the first frequency) and a phase of the data signal in the first time period.

After the clock and data recovery circuit 121 generates the first clock signal through synchronization according to the data signal in the first time period, the oscillator circuit 123 may output an oscillating clock signal having a frequency substantially identical to the frequency of the first clock signal according to the first clock signal (step S210), For example, the oscillator circuit 123 adjusts, according to the first clock signal, an electric field applied to an electrode of its crystal to change its series resonance point or parallel resonance point, so that the frequency of the outputted oscillating clock signal is substantially identical to the frequency of the first clock signal, and the first clock signal may be temporarily stored. That is, the clock and data recovery circuit 121 may lock the frequency of the oscillating clock signal of the oscillator circuit 123 to the frequency of the first clock signal.

Figure 4:
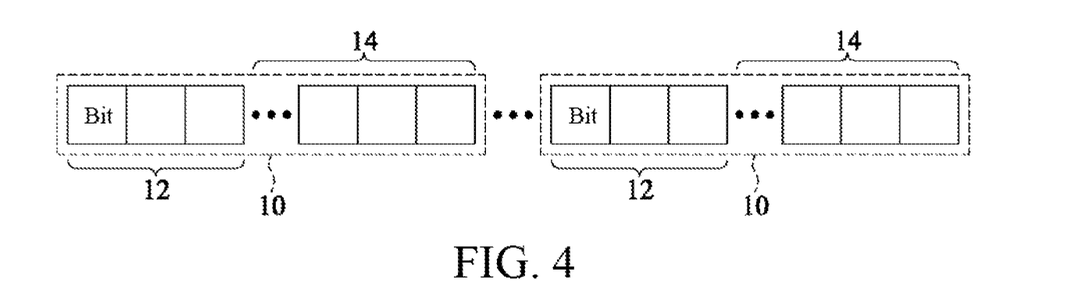
FIG. 4 illustrates a schematic diagram of a packet of a data signal according to some embodiments.

Referring to FIG. 4, FIG. 4 illustrates a schematic diagram of a packet 10 of a data signal according to some embodiments. A data signal may have a plurality of packets 10, and each of the packets 10 may have a plurality of bits. The transmission frequency of the data signal is a value obtained by multiplying a number of bits of a single packet 10 by a packet rate. The packet rate is a number of packets 10 transmitted by using the data signal per unit time. For some reasons an increase in an amount of to-be-transmitted data, a reduction in energy consumption, or the like), the data transmitting terminal 110 changes the transmission frequency of the data signal (e.g., change the transmission frequency by changing the packet rate or the number of bits of the single packet 10). For example, the first frequency is transformed to another higher frequency (referred to as a second frequency below for convenience of description), or the first frequency is transformed to a lower second frequency. In other words, the transmission frequency of the data signal is the first frequency in the first time period, and the first frequency is transformed to a second frequency different from the first frequency in another time period thereafter (for convenience of description, the time period after the transmission frequency of the data signal is changed is referred to as a second time period).

Figure 5:
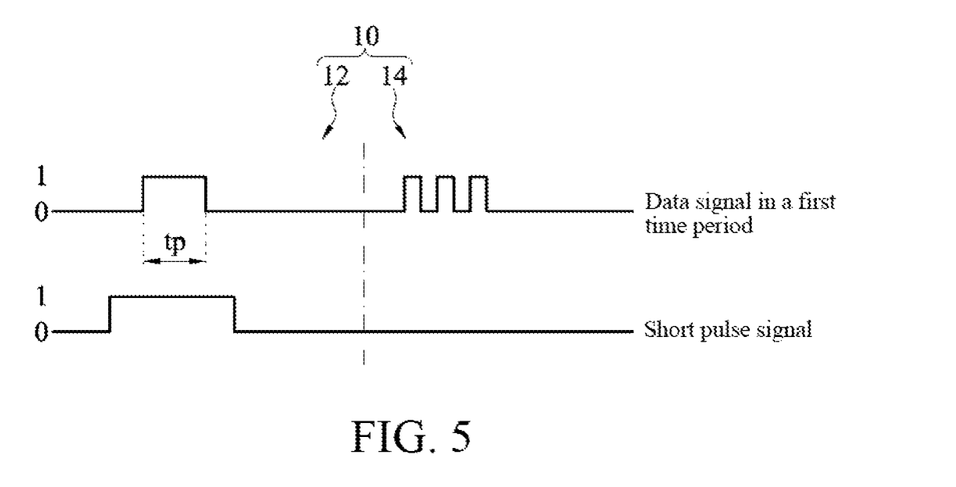
FIG. 5 illustrates a schematic diagram of a packet of a data signal in a first time period according to some embodiments.
Figure 6:
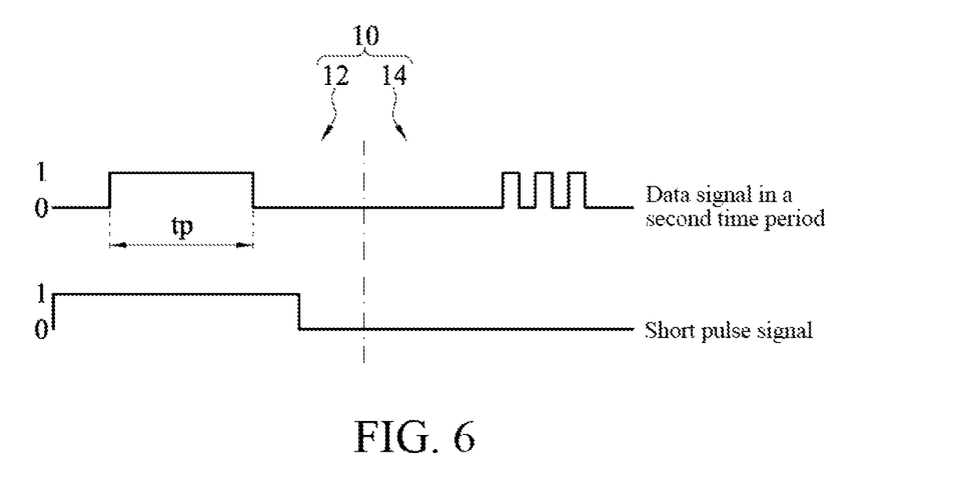
FIG. 6 illustrates a schematic diagram of a packet of a data signal in a second time period according to some embodiments.

For example, referring to FIG. 5 and FIG. 6, FIG. 5 illustrates a schematic diagram of a packet 10 of a data signal in a first time period according to some embodiments, and FIG. 6 illustrates a schematic diagram of a packet 10 of a data signal in a second time period according to some embodiments. In order to clearly present the drawings, FIG. 5 and FIG. 6 each show only one packet 10. As shown in figures, in some embodiments, each of the packets 10 of the data signal may include two parts: a synchronization mark 12 and to-be-transmitted data 14. In some embodiments, each of the packets 10 has a plurality of bits. Some of the bits present the synchronization mark 12, and others of the bits present the to-be-transmitted data 14. For example, each of the packets 10 has 32 bits. First 3 bits present the synchronization mark 12, and remaining bits present the to-be-transmitted data 14. However, the present invention is not limited thereto. The synchronization mark 12 may include one or more bits (3 bits are exemplified herein) at specific positions in the packet 10, and designated bits may be continuous bits or discontinuous bits. Although the synchronization mark 12 is exemplified as the first 3 bits, the present invention is not limited thereto. The synchronization mark 12 may also be at an end of the packet 10 or in an interval of the packet 10.

In some embodiments, the synchronization mark 12 is a pulse signal (e.g., a signal having a pulse width tp shown in FIG. 5 and FIG. 6). The synchronization mark 12 is a signal to be identified by the clock and data recovery circuit 121 (e.g., the clock and data recovery circuit 121 may identify a rising edge or a falling edge (a left edge and a right edge of the pulse width tp shown in FIG. 5 and FIG. 6) of the synchronization mark 12 to determine the packet rate of the data signal), so that the clock and data recovery circuit 121 can determine the packet rate of the data signal according to the synchronization mark 12, and then lock the transmission frequency and the phase to generate the clock signal (e.g., the first clock signal or a second clock signal described later) through synchronization. For example, a frequency detector or a phase detector (such as a phase frequency detector 1211 in FIG. 7) may detect the rising edge or the falling edge of the synchronization mark 12 to obtain the packet rate, so that the clock and data recovery circuit 121 can determine, according to the packet rate, the number of bits of the single packet 10, and the like, the transmission frequency and the phase of the data signal to generate the clock signal through synchronization. In some embodiments, the to-be-transmitted data 14 is to be used by the data receiving terminal 120. For example, the to-be-transmitted data 14 may include a control instruction, audio or video data, and the like.

In some embodiments, the data transmitting terminal 110 may change a cycle of the synchronization mark 12 of the packet 10 of the data signal (referred to as a synchronization mark cycle below) to change the packet rate. For example, the synchronization mark cycle is inversely proportional to the packet rate. The synchronization mark cycle is a time difference between a rising edge (or a falling edge) of a synchronization mark 12 of one packet 10 and a rising edge (or a falling edge) of a synchronization mark 12 of a next packet 10. The data transmitting terminal 110 may change a position of the rising edge or the falling edge of the synchronization mark 12 by changing the pulse width tp of the synchronization mark 12, thereby changing the synchronization mark cycle. For example, as shown in FIG. 5 and FIG. 6, it is shown that a synchronization mark cycle of the data signal in the first time period is longer than a synchronization mark cycle of the data signal in the second time period. Therefore, the packet rate in the first time period is less than the packet rate in the second time period, causing the first frequency of the data signal in the first time period to be lower than the second frequency of the data signal in the second time period.

Referring to FIG. 2 and FIG. 3 again, in response to the transformation of the data signal from the first frequency to the second frequency, the processor 125 executes a resynchronization procedure to oversample the data signal in the second time period to generate a simulated preparation signal conforming to the second frequency (step S214). Furthermore, the clock and data recovery circuit 121 may generate a clock signal through synchronization (which is referred to as a second clock signal below for convenience of description) having a frequency different from the frequency of the first clock signal according to the simulated preparation signal (step S216). Specifically, the clock and data recovery circuit 121 performs frequency locking (described in detail later) and phase locking (described in detail later) for the data signal in the second time period according to the simulated preparation signal to generate the second clock signal through synchronization. The synchronization herein means that a frequency and a phase of the second clock signal are caused to be identical to a frequency (that is, the second frequency) and a phase of the data signal in the second time period. Therefore, the data transmitting terminal 110 does not need to provide an additional preparation signal to enable the clock and data recovery circuit 121 to generate a new clock signal (i.e., the second clock signal) through synchronization. Instead, the clock and data recovery circuit 121 may generate the second clock signal through synchronization directly based on the data signal, thereby reducing system power consumption and reducing a burden of the electronic system 100.

In addition, before the second clock signal is generated through synchronization according to the data signal, the clock and data recovery circuit 121 is synchronized to the oscillating clock signal to maintain outputting of the first clock signal (step S212). For example, before the clock and data recovery circuit 121 generates the second clock signal, the clock and data recovery circuit 121 obtains the oscillating clock signal (whose frequency phase is locked to the first frequency) from the oscillator circuit 123 (e.g., through a path marked with "3" of a multiplexer 130 in FIG. 9), so that the outputting of the first clock signal can be maintained. Therefore, by virtue of the oscillating clock signal conforming to the first frequency generated by the oscillator circuit 123, the clock and data recovery circuit 121 can still be in a normal operation mode according to the first frequency before generating the second clock signal through synchronization.

Figure 7:
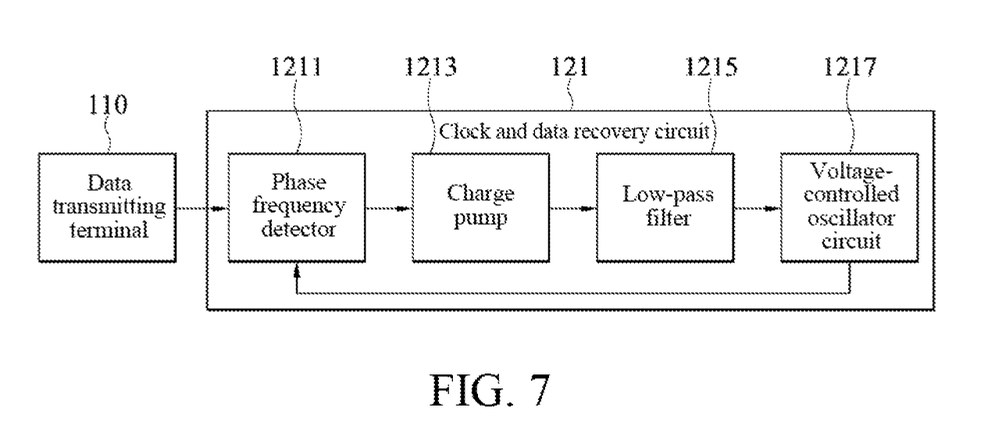
FIG. 7 illustrates a schematic block diagram of a clock and data recovery circuit according to some embodiments.

The way that the clock and data recovery circuit 121 performs frequency locking and phase locking is described below. Referring to FIG. 7, FIG. 7 illustrates a schematic block diagram of a clock and data recovery circuit 121 according to some embodiments. In some embodiments, the clock and data recovery circuit 121 may include a phase frequency detector (PFD) 1211, a charge pump 1213, a low-pass filter 1215, and a voltage-controlled oscillator circuit 1217. The charge pump 1213 is coupled to the phase frequency detector 1211, the low-pass filter 1215 is coupled to the charge pump 1213, and the voltage-controlled oscillator circuit 1217 is coupled to the low-pass filter 1215 and the phase frequency detector 1211. The charge pump 1213 is, for example, but not limited to a DC-DC converter having a capacitor. The low-pass filter 1215 is, for example, but not limited to a filter circuit formed by a resistor and a capacitor or a filter circuit formed by a resistor and an inductor. The voltage-controlled oscillator circuit 1217 is, for example, but not limited to a resonance circuit formed by a varactor diode and an inductor.

The above phase frequency detector 1211 is configured to detect a frequency and a phase of a signal (e.g., the preparation signal, the data signal in the first, time period, the data signal in the second time period, the oscillating clock signal, or the simulated preparation signal) to obtain a detection result, and determine whether the detection result matches a signal fed back by the voltage-controlled oscillator circuit 1217. If the detection result matches the signal, the clock and data recovery circuit 121 outputs a clock signal (e.g., outputs a feedback signal of the voltage-controlled oscillator circuit 1217 after adjustment). If the detection result fails to match the signal, the phase frequency detector 1211 outputs a signal (e.g., a frequency adjustment signal and a phase adjustment signal) for adjusting a frequency and a phase of the feedback signal, to adjust the frequency and the phase of the feedback signal so as to match a frequency and a phase in the detection result. For example, if the frequency or the phase in the detection result fails to match the frequency and the phase of the feedback signal, the phase frequency detector 1211 outputs a frequency adjustment signal or a phase adjustment signal to the charge pump 1213. The charge pump 1213 charges or discharges, in response to the frequency adjustment signal or the phase adjustment signal, at least one capacitor, to output a frequency adjustment voltage or a phase adjustment voltage. For example, if the frequency in the detection result is higher than the frequency of the feedback signal or the phase in the detection result leads the phase of the feedback signal (i.e., when comparing the phase in the detection result with the phase of the feedback signal, the phase in the detection result is in a phase lead), the charge pump 1213 outputs the frequency adjustment voltage or the phase adjustment voltage to increase the frequency or the phase of the feedback signal, or otherwise outputs the frequency adjustment voltage or the phase adjustment voltage to decrease the frequency or the phase of the feedback signal.

The low-pass filter 1215 outputs a frequency control voltage or a phase control voltage according to the frequency adjustment voltage or the phase adjustment voltage. The voltage-controlled oscillator circuit 1217 outputs a feedback signal according to the frequency control voltage or the phase control voltage. For example, if a voltage value of the frequency control voltage or the phase control voltage increases, the frequency of the feedback signal may increase, or otherwise the frequency of the feedback signal may decrease. In some embodiments, the phase frequency detector 1211 first detects the frequency of the signal, and detects the phase of the signal only when the frequency of the signal in the detection result is consistent with the frequency of the feedback signal. Then, the phase frequency detector 1211 adjusts the phase of the feedback signal to be consistent with the phase in the detection result, so that the clock and data recovery circuit 121 outputs the clock signal (i.e., the first clock signal or the second clock signal described above). In some embodiments, the phase frequency detector 1211 includes a frequency detector (FD) and a phase detector (PD) to implement the frequency detection function and the phase detection function of the phase frequency detector 1211. In some embodiments, a frequency bandwidth of a signal that can be locked by using the phase frequency detector 1211 is greater than a frequency bandwidth of a signal that is locked by using only the frequency detector.

Referring to FIG. 8, FIG. 8 illustrates a schematic block diagram of a reference-less clock and data recovery device 1201 according to some embodiments. In some embodiments, the reference-less clock and data recovery device 1201 further includes a data mask circuit 129. The data mask circuit 129 is coupled to the clock and data recovery circuit 121. The data mask circuit 129 is configured to mask the to-be-transmitted data 14 in the packet 10. In some embodiments, the data mask circuit 129 is a circuit including an AND gate. For example, a signal of to-be-masked data is combined with a short pulse signal (e.g., refer to FIG. 5 and FIG. 6) by using the AND gate to obtain the signal of the masked data, but the present invention is not limited thereto.

In some embodiments, in step S208, the data mask circuit 129 of the reference-less clock and data recovery device 1201 of the data receiving terminal 120 is configured to mask the to-be-transmitted data 14 in each of the packets 10 of the data signal in the first time period, so that the clock and data recovery circuit 121 performs, according to an unmasked synchronization mark 12 of the data signal in the first time period, synchronization to output the first dock signal. For example, referring to FIG. 5, the data mask circuit 129 generates the short pulse signal from a time period before the rising edge of the synchronization mark 12 of each of the packets 10 of the data signal in the first time period (e.g., a half of the synchronization mark cycle of the data signal in the first time period) to a time period after the falling edge of the synchronization mark 12 (e.g., a half of the synchronization mark cycle of the data signal in the first time period). The data mask circuit 129 combines the short pulse signal with each of the packets 10 of the data signal in the first time period by using the AND gate to mask the to-be-transmitted data 14 in each of the packets 10 of the data signal in the first time period and obtain an unmasked synchronization mark 12 in each of the packets 10. For example, the to-be-transmitted data 14 in the data signal is combined with a signal having a logic value 0 in the short pulse signal by using the AND gate to mask the to-be-transmitted data 14, and a signal having a logic value 1 in the short pulse signal is combined with the synchronization mark 12 by using the AND gate to obtain the unmasked synchronization mark 12 (i.e., obtain a signal having a logic value 1 in the synchronization mark 12). In some embodiments, the clock and data recovery circuit 121 and the data mask circuit 129 may be integrated into the same circuit.

The clock and data recovery circuit 121 performs synchronization according to the synchronization mark 12 in each of the packets 10 of the data signal to output the first clock signal in the first time period. For example, the clock and data recovery circuit 121 detects the rising edge or the falling edge of the synchronization mark 12 in each of the packets 10 of the data signal in the first time period to obtain the synchronization mark cycle, thereby obtaining the packet rate. The clock and data recovery circuit 121 locks, according to the packet rate, the transmission frequency and the phase of the data signal to generate the first clock signal through synchronization.

In some embodiments, in step S204, the clock and data recovery circuit 121 of the reference-less clock and data recovery device 1201 of the data receiving terminal 120 generates, according to the preparation signal transmitted by the data transmitting terminal 110, a mask clock signal through synchronization, so that the data mask circuit 129 masks the to-be-transmitted data 14 in each of the packets 10 of the data signal in the first time period according to the mask clock signal. In some embodiments, the preparation signal is a sequential signal or a signal having one or more pulses. For example, the clock and data recovery circuit 121 detects rising edges of the pulses of the preparation signal to obtain a transmission frequency and a phase of the preparation signal, and performs frequency locking and phase locking to generate the mask clock signal through synchronization (the mask clock signal herein may be the short pulse signal generated by the data mask circuit 129 for masking the to-be-transmitted data 14 in the packet 10). In some embodiments, the transmission frequency and the phase of the preparation signal conforms to the first frequency and the phase of the data signal in the first time period. In some embodiments, positions of the rising edges and the falling edges of the pulses in the preparation signal may be identical to positions of the rising edge and the falling edge of the synchronization mark 12 in each of the packets 10 of the data signal in the first time period. In some embodiments, similar to the above embodiment of masking the to-be-transmitted data 14 in the data signal in the first time period, the data mask circuit 129 obtains the positions of the rising edge and the falling edge of the synchronization mark 12 in each of the packets 10 of the data signal in the first time period according to the mask clock signal, thereby masking the to-be-transmitted data 14 in each of the packets 10 in the first time period according to the positions of the rising edge and the falling edge of the synchronization mark 12. For example, the data mask circuit 129 combines the mask clock signal with the data signal in the first time period by using the AND gate to mask the to-be-transmitted data 14 in the packet 10.

In some embodiments, in step S216, the data mask circuit 129 masks the to-be-transmitted data 14 in each of the packets 10 of the data signal in the second time period according to the simulated preparation signal, so that the clock and data recovery circuit 121 performs synchronization according to an unmasked synchronization mark 12 in the data signal to output a second clock signal in the second time period. In some embodiments, the simulated preparation signal may be a sequential signal or a signal having one or more pulses. For example, referring to FIG. 6, similar to the above embodiment in which the to-be-transmitted data 14 in the data signal in the first time period is masked, the data mask circuit 129 obtains the positions of the rising edge and the falling edge of the synchronization mark 12 in each of the packets 10 of the data signal in the second time period according to the simulated preparation signal, thereby masking the to-be-transmitted data 14 in each of the packets 10 of the data signal in the second time period according to the positions of the rising edge and the falling edge of the synchronization mark 12 in each of the packets 10. For example, the data mask circuit 129 combines the data signal in the second time period with the simulated preparation signal by using the AND gate to mask the to-be-transmitted data 14 in each of the packets 10. The simulated preparation signal may be the above short pulse signal generated by the data mask circuit 129 for masking the to-be-transmitted data 14 in the packet 10.

The above clock and data recovery circuit 121 performs synchronization according to the synchronization mark 12 in each of the packets 10 of the data signal to output the second clock signal in the second time period. For example, similar to the above embodiment in which the first clock signal is outputted according to the synchronization mark 12 in the first time period, the clock and data recovery circuit 121 detects the rising edge or the falling edge of the synchronization mark 12 in each of the packets 10 of the data signal in the second time period to obtain the synchronization mark cycle, thereby obtaining the packet rate. The clock and data recovery circuit 121 locking, according to the packet rate, the transmission frequency and the phase of the data signal to generate the second clock signal through synchronization.

Referring to FIG. 9, FIG. 9 illustrates a schematic block diagram of a reference-less clock and data recovery device 1201 according to some embodiments. In some embodiments, the reference-less clock and data recovery device 1201 further includes a multiplexer 130. The multiplexer 130 includes a plurality of input terminals and one output terminal. The output terminal is coupled to the clock and data recovery circuit 121, and the input terminal is coupled to the data transmitting terminal 110 (via a path marked with "0"), the data mask circuit 129 (via a path marked with "1"), the processor 125 (via a path marked with "2"), and the oscillator circuit 123 (via a path marked with "3") to receive the masked data signal, the oscillating clock signal, the simulated preparation signal, and the preparation signal. The multiplexer 130 is configured to selectively output the received signals at different time points, so that the output terminal transmits, to the clock and data recovery circuit 121, the masked data signal, the oscillating clock signal, the simulated preparation signal, or the preparation signal. For example, during the preparation time period, the output terminal of the multiplexer 130 is controlled to transmit the preparation signal (via the path marked with "0"). In the first time period or the second time period, the output terminal of the multiplexer 130 is controlled to transmit the masked data signal (via the path marked with "1"). Before the second clock signal is generated through synchronization, the output terminal of the multiplexer 130 is controlled to transmit the oscillating clock signal (via the path marked with "3").

When the processor 125 generates the simulated preparation signal, the output terminal of the multiplexer 130 is controlled to transmit the simulated preparation signal (via the path marked with "2"). In some embodiments, the multiplexer 130 is a many-to-one multiplexer. In some embodiments, the multiplexer 130 may be composed of one or more multiplexer circuits.

In some embodiments, the data mask circuit 129 is further coupled to the processor 125 (not shown). In this case, the input terminal of the multiplexer 130 may be coupled to only the data mask circuit 129 and the oscillator circuit 123 to receive the masked data signal and the oscillating clock signal, and selectively output the received signals at different time points, so that the output terminal transmits the masked data signal or the oscillating clock signal to the clock and data recovery circuit 121.

In some embodiments, in step S214, in the resynchronization procedure, the processor 125 transforms the data signal in the second time period from an analog signal to a digital signal (e.g., the processor 125 converts the data signal in the second time period from an analog signal to a digital signal through an analog-to-digital converter). The processor 125 oversamples the data signal in the second time period by using a high-frequency sampling signal (e.g., the data signal in the second time period is expanded through a digital signal processor (e.g., data carried in the data signal in the second time period is copied and increased)). For example the processor 125 samples the data signal in the second time period processed into the digital signal in a majority-vote manner by using the high-frequency sampling signal, so as to generate the simulated preparation signal conforming to the second frequency. Then an input source of the multiplexer 130 is switched to the processor 125, so that the clock and data recovery circuit 121 can perform preliminary synchronization for the data signal in the second time period. After the preliminary synchronization is completed, the input source of the multiplexer 130 is switched to the data mask circuit 129, so that the clock and data recovery circuit 121 can complete the synchronization for the data signal in the second time period.

In some embodiments, a frequency of the sampling signal for oversampling is greater than a frequency of the sampled signal. For example, the frequency of the sampling signal is a plurality of times (such as 1.5 times, 2 times, 3 times, or the like) the transmission frequency (such as the first frequency or the second frequency) of the data signal.

In some embodiments, the to-be-transmitted data 14 in one of the packets 10 of the data signal in the first time period includes a frequency transformation notification. In some embodiments, in step S214, the processor 125 initializes the resynchronization procedure in response to the frequency transformation notification. The frequency transformation notification may be transformation information about the transformation of the data signal from the first frequency to the second frequency, such as the time point at which or the time period during which the transformation is performed, a number of packets 10 prior to next transformation, and the like, but the present invention is not limited thereto. The processor 125 initiates the resynchronization procedure in response to the frequency transformation notification to oversample the data signal in the second time period and to generate the simulated preparation clock signal. Then an input source of the multiplexer 130 is switched to the processor 125, so that the clock and data recovery circuit 121 performs preliminary synchronization for the data signal in the second time period. After the preliminary synchronization is completed, the input source of the multiplexer 130 is switched to the data mask circuit 129, so that the clock and data recovery circuit 121 can complete the synchronization for the data signal in the second time period. In some embodiments, the to-be-transmitted data 14 further includes a control command for controlling the data receiving terminal 120 and data (e.g., audio data and/or video data) to be used by the data receiving terminal 120.

In some embodiments, the to-be-transmitted data 14 in one of the packets 10 of the data signal in the first time period includes frequency information about the second frequency. In some embodiments, in step S214, the processor 125 determines a sampling frequency for oversampling according to the frequency information. In detail, the processor 125 obtains a value of the second frequency according to the frequency information, and determines the sampling frequency for oversampling according to the value of the second frequency. For example, the sampling frequency for oversampling is at least three times the value of the second frequency. In some embodiments, the frequency information about the second frequency is a ratio relationship between the first frequency and the second frequency or the value of the second frequency. In some embodiments, the frequency information about the second frequency may be code, and different code indications correspond to different frequency values.

Referring to FIG. 8 and FIG. 9, in some embodiments, the reference-less clock and data recovery device 1201 further includes a frequency multiplier circuit 127. The frequency multiplier circuit 127 is coupled to the oscillator circuit 123 and the processor 125. The frequency multiplier circuit 127 is configured to increase a frequency of a signal. In some embodiments, the frequency multiplier circuit 127 is, for example, but not limited to a frequency multiplier. In some embodiments, in step S214, the frequency multiplier circuit 127 is configured to receive the oscillating clock signal and increase the frequency of the oscillating clock signal to generate a high-frequency clock signal. In this way, the processor 125 can perform oversampling by using the high-frequency clock signal as the sampling frequency. The frequency multiplication herein refers to increasing the frequency of the signal according to a specific multiple. For example, the frequency of the oscillating clock signal is amplified by 1.5 times, 2 times, 3 times, and the like to generate the high-frequency clock signal, but the present invention is not limited thereto.

In some embodiments, the frequency multiplier circuit 127 increases the frequency of the oscillating clock signal according to a determined sampling frequency to generate the high-frequency clock signal. For example, the frequency multiplier circuit 127 increases the frequency of the oscillating clock signal according to the ratio relationship between the determined sampling frequency and the frequency of the oscillating clock signal to generate the high-frequency clock signal, and then the processor 125 performs oversampling according to the high-frequency clock signal. In some embodiments, the frequency multiplier circuit 127 may be understood as a phase-locked loop (PLL).

Referring to FIG. 8 and FIG. 9, in some embodiments, the reference-less clock and data recovery device 1201 further includes a decision circuit 128. The decision circuit 128 is coupled to the clock and data recovery circuit 121. In some embodiments, the decision circuit 128 is further coupled to the data transmitting terminal 110. The decision circuit 128 is, for example, but not limited to an operation circuit such as a central processing unit, a microprocessor, an application-specific integrated circuit, a system-on-chip, or the like.

In some embodiments, the processor 125 and the decision circuit 128 may be integrated together. The decision circuit 128 is configured to calculate the transmission frequency of the data signal according to the clock signal (e.g., including the first clock signal and the second clock signal), and read the to-be-transmitted data 14 from the packet 10 of the data signal of the data transmitting terminal 110 according to the calculated transmission frequency. For example, the decision circuit 128 multiplies the frequency of the clock signal by the number of bits in the packet 10 of the data signal to calculate the transmission frequency of the data signal.

Specifically, after the clock and data recovery circuit 121 generates the first clock signal through synchronization (step S208), the decision circuit 128 calculates the first frequency according to the first clock signal to capture the to-be-transmitted data 14 in the packet 10 of the data signal in the first time period. After the clock and data recovery circuit 121 generates the second clock signal through synchronization (step S216), the decision circuit 128 calculates the second frequency according to the second clock signal to capture the to-be-transmitted data 14 in the packet 10 of the data signal in the second time period. For example, when the clock and data recovery circuit 121 is in a synchronized state (e.g., when the first clock signal or the second clock signal is generated through synchronization by the clock and data recovery circuit 121), the clock and data recovery circuit 121 transmits a status signal indicating a "synchronously locked" status, or otherwise transmits a status signal indicating a "not synchronously locked" status. The decision circuit 128 determines, according to the status signal, whether the clock and data recovery circuit 121 is in a synchronized status. When the decision circuit 128 determines that the clock and data recovery circuit 121 is in the "synchronously locked" status and the data signal is in the first time period, the decision circuit 128 samples, according to the value of the first frequency calculated based on the first clock signal, the data signal to capture the to-be-transmitted data 14, thereby transmitting the captured to-be-transmitted data 14 to other circuits (such as other processing units (not shown), which are generally a digital circuit in the data receiving terminal 120) for subsequent data processing. Similarly, when the clock and data recovery circuit 121 is in the "synchronously locked" status and the data signal is in the second time period, the decision circuit 128 samples, according to the value of the second frequency calculated based on the second clock signal, the data signal to capture the to-be-transmitted data 14, thereby transmitting the captured to-be-transmitted data 14 to other circuits (such as other processing units (not shown)) for subsequent data processing.

Figure 10:
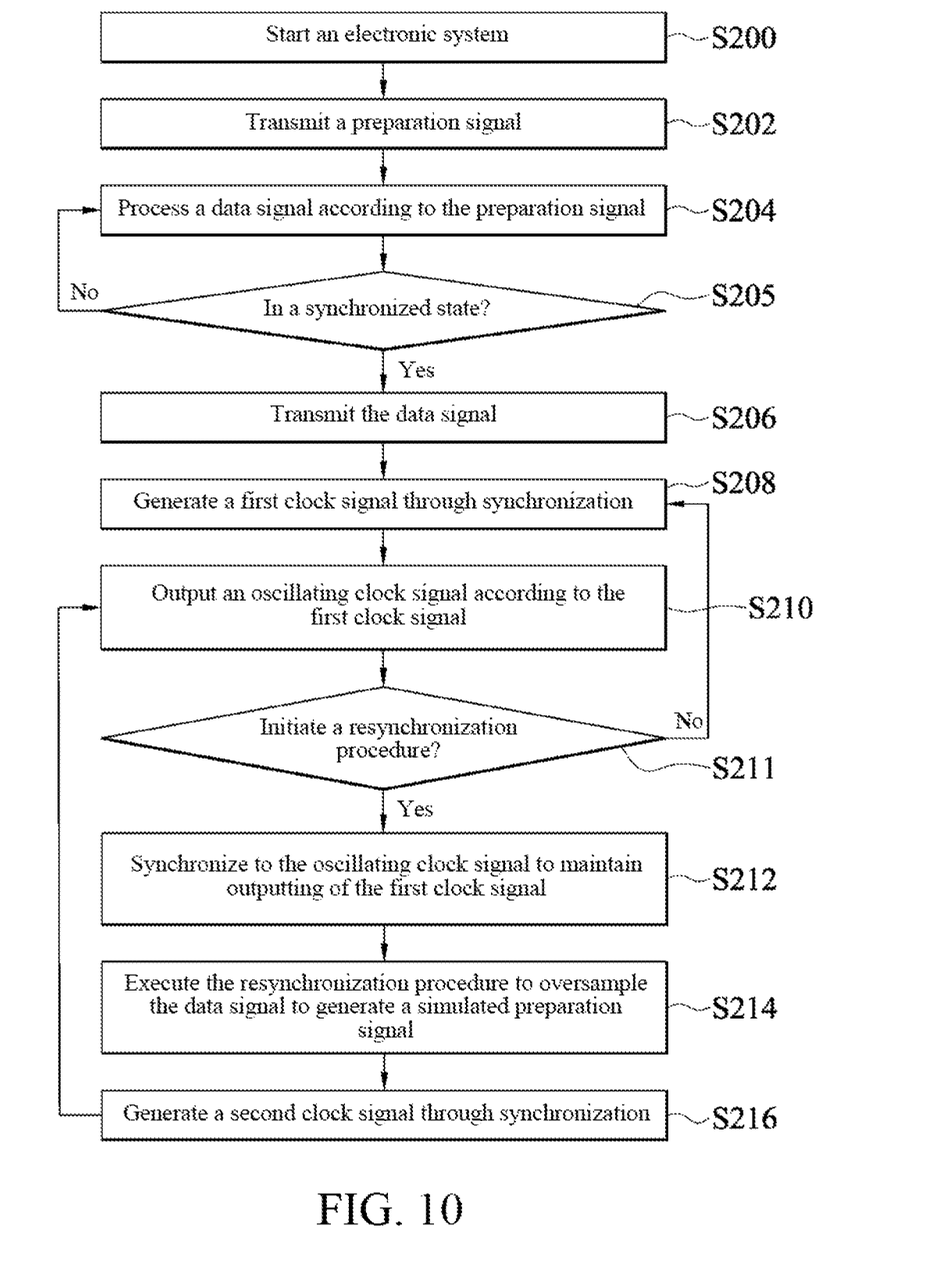
FIG. 10 illustrates a flowchart of a reference-less clock and data recovery method according to some embodiments.

Referring to FIG. 10, FIG. 10 illustrates a flowchart of a reference-less clock and data recovery method according to some embodiments. For steps S200~S204, reference may be made to the embodiment of FIG. 3. Referring to FIG. 8 and FIG. 9 together, in some embodiments, after step S204, the decision circuit 128 or the processor 125 determines whether the clock and data recovery circuit 121 generates the mask clock signal through synchronization (step S205), If the mask clock signal is generated through synchronization, the data transmitting terminal 110 is controlled to transmit the data signal (step S206). If the mask clock signal is not generated through synchronization, the data receiving terminal 120 continuously processes the data signal according to the preparation signal (step S204). For example, the decision circuit 128 or the processor 125 determines, according to the status signal from the clock and data recovery circuit 121, whether the clock and data recovery circuit 121 is in a synchronized state. If the clock and data recovery circuit 121 is determined to be in the "synchronously locked" status and in the preparation time period, the decision circuit 128 or the processor 125 transmits a data transmission request to the data transmitting terminal 110, so that the data transmitting terminal 110 transmits the data signal in response to the data transmission request (step S206). If the clock and data recovery circuit 121 is determined to be in the "not synchronously locked" status and in the preparation time period, the data receiving terminal 120 continuously processes the data signal according to the preparation signal (step S204).

In some embodiments, after step S210, the processor 125 determines whether to initiate the resynchronization procedure (step S211). If the processor 125 determines to initiate the resynchronization procedure, the clock and data recovery circuit 121 is controlled to maintain the outputting of the first clock signal according to the oscillating clock signal (step S212), and then the processor 125 executes the resynchronization procedure (step S214), After the processor 125 generates the simulated preparation signal through oversampling, the input source of the multiplexer 130 is switched to the processor 125, so that the clock and data recovery circuit 121 can perform preliminary synchronization for the data signal in the second time period. After the preliminary synchronization is completed, the input source of the multiplexer 130 is switched to the data mask circuit 129, so that the clock and data recovery circuit 121 can complete the synchronization for the data signal in the second time period (step S216). If the processor 125 determines not to initiate the resynchronization procedure, the clock and data recovery circuit 121 is controlled to continuously generate the first clock signal through synchronization (step S208) and continue subsequent steps.

For example, the processor 125 determines whether to initiate the resynchronization procedure according to the frequency transformation notification. For example, the processor 125 learns, by analyzing the frequency transformation notification, the transformation information about the transformation of the data signal from the first frequency to the second frequency, such as the time point at which or the time period during which the transformation is performed, a number of packets 10 prior to next transformation, and the like. When determining, according to the frequency transformation notification, that the first frequency of the data signal is to be transformed to the second frequency, the processor 125 initiates the resynchronization procedure, and the clock and data recovery circuit 121 is controlled to maintain the outputting of the first clock signal according to the oscillating clock signal (step S212). Then after the processor 125 executes the resynchronization procedure (step S214) and generates the simulated preparation signal through oversampling, the clock and data recovery circuit 121 can complete the synchronization for the data signal in the second time period, that is, generate the second clock signal (step S216). Before the processor 125 determines, according to the frequency transformation notification, that the first frequency of the data signal is to be transformed to the second frequency, the processor 125 does not initiate the resynchronization procedure, and the clock and data recovery circuit 121 is caused to continuously generate the first clock signal through synchronization (step S208) and continue subsequent steps.

In some embodiments, after step S216, subsequent steps may be performed by using the second clock signal as a new first clock signal. For example, after step S216, the oscillator circuit 123 outputs an oscillating clock signal according to the new first clock signal (step S210) and continues subsequent steps.

Therefore, according to some embodiments, the clock signal corresponding to the data signal before the frequency transformation is generated by virtue of the oscillator circuit for the clock and data recovery circuit to continuously output the clock signal, so that the data receiving terminal can continuously obtain the to-be-transmitted data carried in the data signal according to the clock signal. By oversampling the data signal after the frequency transformation to obtain the simulated preparation signal, the clock and data recovery circuit can generate, through synchronization, the clock signal corresponding to the data signal after the frequency transformation according to the simulated preparation signal, thereby reducing the system power consumption and the system burden.

What is claimed is:

1. A reference-less clock and data recovery device, comprising:
    a clock and data recovery circuit configured to receive a data signal from a data transmitting terminal, wherein a transmission frequency of the data signal is a first frequency in a first time period and is transformed to a second frequency in a second time period, and the clock and data recovery circuit generates a first clock signal through synchronization according to the data signal in the first time period;
    an oscillator circuit coupled to the clock and data recovery circuit and configured to output an oscillating clock signal according to the first clock signal, wherein a frequency of the oscillating clock signal is substantially identical to a frequency of the first clock signal; and
    a processor coupled to the clock and data recovery circuit and configured to execute a resynchronization procedure to oversample the data signal in the second time period to generate a simulated preparation signal conforming to the second frequency; wherein
    the clock and data recovery circuit generates a second clock signal through synchronization according to the simulated preparation signal, and before generating the second clock signal through synchronization, the clock and data recovery circuit is synchronized to the oscillating clock signal to maintain outputting of the first clock signal.

2. The reference-less clock and data recovery device according to claim 1, further comprising a frequency multiplier circuit, wherein the frequency multiplier circuit is coupled to the oscillator circuit to receive the oscillating clock signal and multiply the frequency of the oscillating clock signal to generate a high-frequency clock signal, and the processor oversamples the data signal in the second time period according to the high-frequency clock signal.

3. The reference-less clock and data recovery device according to claim 1, wherein a plurality of packets of the data signal each comprise a synchronization mark and to-be-transmitted data, and the reference-less clock and data recovery device further comprises:
    a data mask circuit coupled to the dock and data recovery circuit and configured to mask the to-be-transmitted data, but keep the synchronization mark, comprised in the packets of the data signal in the first time period, so that the clock and data recovery circuit performs synchronization according to the synchronization mark to output the first clock signal in the first time period.

4. The reference-less clock and data recovery device according to claim 3, wherein in a preparation time period before the first time period, the clock and data recovery circuit receives a preparation signal from the data transmitting terminal and generates a mask clock signal through synchronization according to the preparation signal, so that the data mask circuit masks the to-be-transmitted data in the packets of the data signal according to the mask clock signal in the first time period, wherein a transmission frequency of the preparation signal conforms to the first frequency.

5. The reference-less clock and data recovery device according to claim 4, further comprising:
    a multiplexer comprising a plurality of input terminals and an output terminal, wherein the output terminal is coupled to the clock and data recovery circuit, the input terminals are respectively coupled to the data mask circuit, the oscillator circuit, the processor, and the data transmitting terminal to receive a masked data signal, the oscillating clock signal, the simulated preparation signal, and the preparation signal, and the multiplexer is configured to selectively enable the output terminal to transmit the masked data signal, the oscillating clock signal, the simulated preparation signal, or the preparation signal to the clock and data recovery circuit at a different time point.

6. The reference-less clock and data recovery device according to claim 3, wherein the data mask circuit masks the to-be-transmitted data, but keeps the synchronization mark, comprised in the packets of the data signal in the second time period according to the simulated preparation signal, so that the clock and data recovery circuit performs synchronization according to the synchronization mark to output the second clock signal in the second time period.

7. The reference-less clock and data recovery device according to claim 6, further comprising:
    a multiplexer comprising a plurality of input terminals and an output terminal, wherein the output terminal is coupled to the clock and data recovery circuit, the input terminals are respectively coupled to the data mask circuit and the oscillator circuit to receive a masked data signal and the simulated preparation signal, and the multiplexer is configured to selectively enable the output terminal to transmit the masked data signal or the simulated preparation signal to the clock and data recovery circuit at a different time point.

8. The reference-less clock and data recovery device according to claim 1, further comprising a decision circuit, wherein the decision circuit is configured to calculate, according to the first clock signal, the first frequency to capture to-be-transmitted data in a plurality of packets of the data signal in the first time period and calculate, according to the second clock signal, the second frequency to capture the to-be-transmitted data in the packets of the data signal in the second time period.

9. The reference-less clock and data recovery device according to claim 1, wherein a packet of the data signal in the first time period comprises a frequency transformation notification, and the processor initiates the resynchronization procedure in response to the frequency transformation notification.

10. The reference-less clock and data recovery device according to claim 1, wherein a packet of the data signal in the first time period comprises frequency information about the second frequency, and the processor determines a sampling frequency for oversampling according to the frequency information.

11. The reference-less clock and data recovery device according to claim 10, further comprising a frequency multiplier circuit, wherein the frequency multiplier circuit is coupled to the oscillator circuit and is configured to receive the oscillating clock signal and multiply the frequency of the oscillating clock signal according to a determined sampling frequency to generate a high-frequency clock signal, and the processor performs oversampling according to the high-frequency clock signal.

12. A reference-less clock and data recovery method, adapted to a reference-less clock and data recovery device, wherein the reference-less clock and data recovery device comprises a dock and data recovery circuit, an oscillator circuit, and a processor, and the reference-less clock and data recovery method comprises:

receiving, by the clock and data recovery circuit, a data signal from a data transmitting terminal, wherein a transmission frequency of the data signal is a first frequency in a first time period and is transformed to a second frequency in a second time period;

generating, by the clock and data recovery circuit, a first clock signal through synchronization according to the data signal in the first time period;

outputting, by the oscillator circuit, an oscillating clock signal according to the first clock signal, wherein a frequency of the oscillating clock signal is substantially identical to a frequency of the first clock signal;

executing, by the processor, a resynchronization procedure to oversample the data signal in the second time period to generate a simulated preparation signal conforming to the second frequency;

generating, by the clock and data recovery circuit, a second clock signal through synchronization according to the simulated preparation signal; and before generating the second clock signal through synchronization, synchronizing the clock and data recovery circuit to the oscillating clock signal to maintain outputting of the first clock signal.

13. The reference-less clock and data recovery method according to claim 12, wherein the reference-less clock and data recovery device further comprises a frequency multiplier circuit, and the reference-less clock and data recovery method further comprises:

multiplying, by the frequency multiplier circuit, the frequency of the oscillating clock signal to generate a high-frequency clock signal; wherein the step of oversampling the data signal in the second time period comprises oversampling according to the high-frequency clock signal.

14. The reference-less clock and data recovery method according to claim 12, wherein a plurality of packets of the data signal each comprise a synchronization mark and to-be-transmitted data, the reference-less clock and data recovery device further comprises a data mask circuit, and the reference-less clock and data recovery method further comprises:

masking, by the data mask circuit, the to-be-transmitted data, but keeping the synchronization mark, comprised in the packets of the data signal in the first time period; wherein the step of generating the first clock signal through synchronization comprises performing, by the clock and data recovery circuit, synchronization according to the synchronization mark to output the first clock signal in the first time period.

15. The reference-less clock and data recovery method according to claim 14, further comprising:

in a preparation time period before the first time period, generating, by the clock and data recovery circuit, a mask clock signal according to a preparation signal from the data transmitting terminal, wherein a transmission frequency of the preparation signal conforms to the first frequency; wherein the step of masking the to-be-transmitted data in the first time period comprises masking, by the clock and data recovery circuit, the to-be-transmitted data according to the mask clock signal in the first time period.

16. The reference-less clock and data recovery method according to claim 14, further comprising:

masking, by the data mask circuit, the to-be-transmitted data, but keeping the synchronization mark, comprised in the packets of the data signal in the second time period according to the simulated preparation signal; wherein the step of generating the second clock signal through synchronization comprises performing, by the clock and data recovery circuit, synchronization according to the synchronization mark to output the second clock signal in the second time period.

17. The reference-less clock and data recovery method according to claim 12, wherein the reference-less clock and data recovery device further comprises a decision circuit; and the reference-less clock and data recovery method further comprises:

calculating, by the decision circuit, the first frequency according to the first clock signal to capture to-be-transmitted data in a plurality of packets of the data signal in the first time period; and calculating, by the decision circuit, the second frequency according to the second clock signal to capture the to-be-transmitted data in the packets of the data signal in the second time period.

18. The reference-less clock and data recovery method according to claim 12, wherein a packet of the data signal in the first time period comprises a frequency transformation notification, and the reference-less clock and data recovery method further comprises: initiating, by the processor, the resynchronization procedure in response to the frequency transformation notification.

19. The reference-less clock and data recovery method according to claim 12, wherein a packet of the data signal in the first time period comprises frequency information about the second frequency, and the reference-less clock and data recovery method further comprises: determining, by the processor, a sampling frequency for oversampling, according to the frequency information.

20. The reference-less clock and data recovery method according to claim 19, wherein the reference-less clock and data recovery device further comprises a frequency multiplier circuit, and the reference-less clock and data recovery method further comprises:

multiplying, by the frequency multiplier circuit, the frequency of the oscillating clock signal according to a determined sampling frequency to generate a high-frequency clock signal; wherein the step of oversampling the data signal in the second time period comprises oversampling according to the high-frequency clock signal.

* * * * *